United States Patent
Pearson et al.

(10) Patent No.: US 7,983,343 B2
(45) Date of Patent: Jul. 19, 2011

(54) CONTEXT ADAPTIVE BINARY ARITHMETIC DECODING FOR HIGH DEFINITION VIDEO

(75) Inventors: Eric C. Pearson, Conestogo (CA); Harminder S. Banwait, Waterloo (CA)

(73) Assignee: LSI Corporation, Milpitas, CA (US)

( * ) Notice: Subject to any disclaimer, the term of this patent is extended or adjusted under 35 U.S.C. 154(b) by 1590 days.

(21) Appl. No.: 11/331,404

(22) Filed: Jan. 12, 2006

(65) Prior Publication Data
US 2007/0183491 A1    Aug. 9, 2007

(51) Int. Cl.
H04N 7/12 (2006.01)
H04N 11/02 (2006.01)
H04N 11/04 (2006.01)
(52) U.S. Cl. .................................. 375/240.25
(58) Field of Classification Search .................. 375/240, 375/240.2, 240.03, 240.08, 240.11, 240.16, 375/240.18, 240.23, 240.24, 240.25, 240.26; 341/50, 51, 55, 57, 106, 107
See application file for complete search history.

(56) References Cited

U.S. PATENT DOCUMENTS

| | | | |
|---|---|---|---|
| 5,381,145 A * | 1/1995 | Allen et al. | 341/107 |
| 7,460,041 B2 * | 12/2008 | Yang et al. | 341/107 |
| 2005/0088324 A1 * | 4/2005 | Fuchigami et al. | 341/107 |
| 2005/0179572 A1 * | 8/2005 | Winger | 341/107 |
| 2005/0259747 A1 * | 11/2005 | Schumann | 375/240.25 |
| 2006/0126744 A1 * | 6/2006 | Peng et al. | 375/240.26 |

FOREIGN PATENT DOCUMENTS
CN            1610265          4/2005

* cited by examiner

*Primary Examiner* — David C. Payne
*Assistant Examiner* — Syed Haider
(74) *Attorney, Agent, or Firm* — Christopher P. Maiorana, PC

(57) ABSTRACT

An apparatus comprising a first circuit and a second circuit. The first circuit may be configured to present a video signal and macroblock data in response to decoding one or more bins on a binary signal. The second circuit may be configured to, in parallel (i) generate the binary signal in response to a bitstream signal and an initial context information and (ii) calculate subsequent context information.

2 Claims, 3 Drawing Sheets

US 7,983,343 B2

CONTEXT ADAPTIVE BINARY ARITHMETIC DECODING FOR HIGH DEFINITION VIDEO

FIELD OF THE INVENTION

The present invention relates to digital video generally and, more particularly, to a method and/or apparatus for implementing context adaptive binary arithmetic decoding for high definition video.

BACKGROUND OF THE INVENTION

Conventional H.264 video codec systems include, as part of the main profile, a context adaptive binary arithmetic-coding (CABAC) process. The CABAC process uses a serial process which needs both a context (or context model) and the results of a previous arithmetic decode operation to decode a binary information bit (or bin) from an encoded bitstream. The arithmetic decode operation as normatively defined is a laborious time consuming operation. While determining the context, neighborhood information (both above and left) is needed from previously decoded syntax elements within either current or neighboring macroblocks (or neighboring macroblocks to the current macroblock). It is difficult to meet the goal of real-time high definition (HD) video decode because determining context and arithmetic decoding use significantly large calculations. H.264 main or high profile decoders will tend to encounter difficulties in video decoding of real-time high definition (HD) sources for the life of the H.264 standard protocol.

The H.264 standard (or JVT-050 H.264/AVC standard, JVT-050 or more recently: ITU-T Rec H.264|ISO/IEC 14496-10 and all amendments, Current Revisions H.264(E)) uses serial execution of arithmetic decodes, and a full syntax element decode. Further, a full decode of previous macroblocks is performed to provide macroblock neighbor context information. By providing the macroblock neighbor context information the period between decoding (i) the last bin of the previous macroblock and (ii) the first bin of the current macroblock is increased. Conventional methods limit the CABAC decode rate to the rate supported by the serial implementation. In particular, conventional methods limit CABAC decode rates by supporting lower profiles and/or constraining these limits within a proprietary framework.

It would be desirable to provide a method and/or apparatus that performs context calculations in parallel with arithmetic decoding operations.

SUMMARY OF THE INVENTION

The present invention concerns an apparatus comprising a first circuit and a second circuit. The first circuit may be configured to present a video signal and macroblock data in response to decoding one or more bins on a binary signal. The second circuit may be configured to, in parallel (i) generate the binary signal in response to a bitstream signal and an initial context information and (ii) calculate subsequent context information.

The objects, features and advantages of the present invention include providing a context adaptive binary arithmetic decoding that may (i) perform context calculations in parallel with arithmetic decode, (ii) provide quicker access to data needed for context calculations by performing a partial decode of syntax elements using a state machine, (iii) provide subsequent contexts for possible outcomes that are pre-calculated, (iv) select when the arithmetic decode has determined a bin value with a multiplexer, (iv) be speed-up due to the parallelism of arithmetic decode and next context calculation, (v) achieve speedup without needing a full decode of a previous syntax elements within the macroblock context information, (vi) achieve speedup without needing a full decode of a previous macroblock for neighbor context information, (vii) provide higher CABAC decode speeds that are supportable for a given very large scale integration (VLSI) technology and/or (viii) run at maximal decode speed supported by a given VLSI technology.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
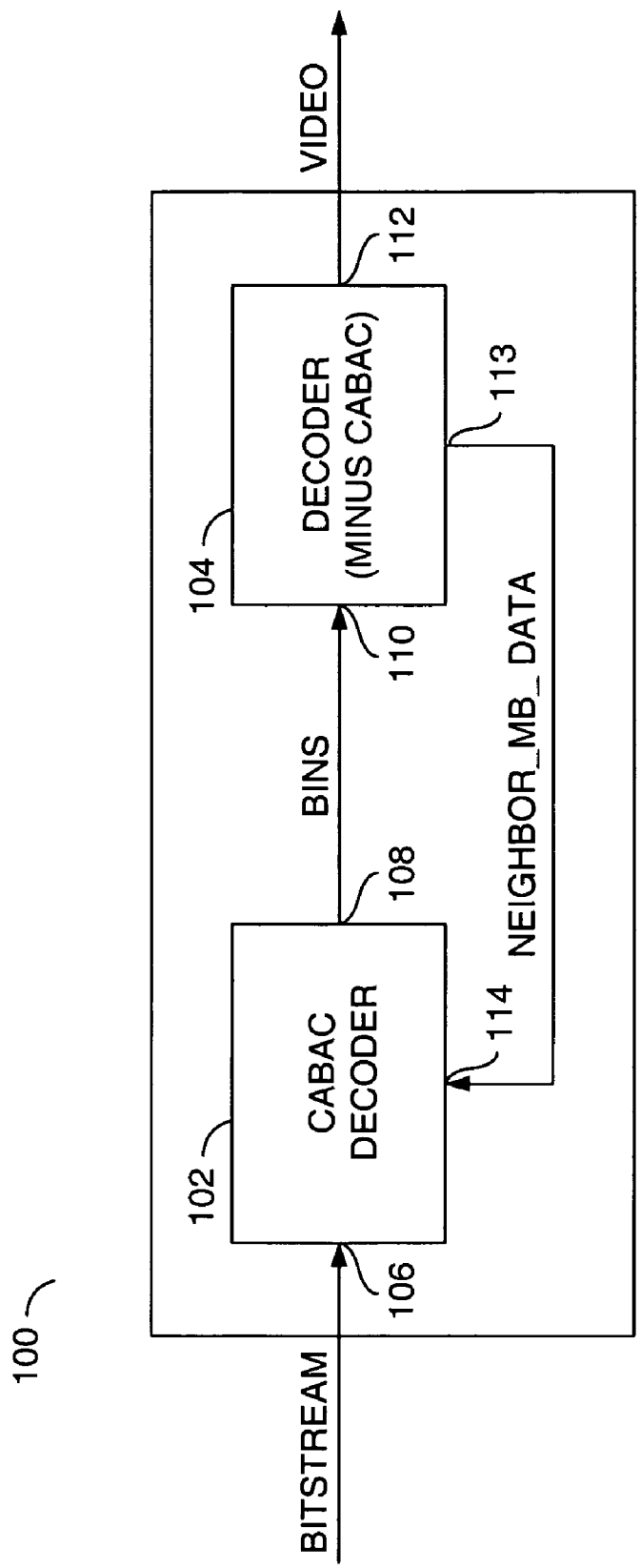
FIG. 1 is a block diagram of a context of the present invention.

Referring to FIG. 1, a block diagram of a system 100 is shown in accordance with a preferred embodiment of the present invention. The system 100 generally comprises a block (or circuit) 102 and a block (or circuit) 104. The circuit 102 generally comprises a context adaptive binary arithmetic coding (CABAC) decoder. The circuit 104 generally comprises a decoder without the CABAC decoding portion. The CABAC decoder 102 may have an input 106 that may receive a signal (e.g., BITSTREAM) and an input 114 that may receive a signal (e.g., NEIGHBOR_MB_DATA). The CABAC decoder 102 may have an output 108 that may present a signal (e.g., BINS). The decoder 104 may have an input 110 that may receive the signal BINS. The decoder 104 may have an output 112 that may present a signal (e.g., VIDEO) and an output 113 that may present the signal NEIGHBOR_MB_DATA.

The system 100 may support a main or high profile. In one example, the decoder 102 may be an H.264 decoder. Since the system 100 may support either a main or high profile, the decoder 102 may support CABAC. The CABAC decoder 102 may determine the context information to decode (with an integer) a bin before the decoder 104 decodes each bin (or binary information bit) over the signal BINS. The context information may be derived from temporally previous and/or spatially adjacent data. The context information may be decoded (i) within a current macroblock data and (ii) as a neighbor macroblock data (from macroblocks to the left, and above a current macroblock). As defined by the H.264 Standard, the neighborhood macroblock data may include (i) 1× Macroblock availability (binary), (ii) 1× Macroblock Type and 4× Sub Macroblock Type (integer), (iii) 1× Macroblock coded as field or frame (binary), (iv) 4× Reference Index's (ref_idx) (integer), (v) 8× Motion Vector Difference (MVD) (integer), (vi) 4× Count of block non-zero coefficients (integer), (vii) 1× Coded Block Pattern (CBP) (integer), (viii) 1× Transform_size_8×8_flag (binary), and (ix) 1× Intra_chroma_pred_mode (integer).

The CABAC decoder 102 may generate bins in response to (i) the neighborhood macroblock data over the signal NEIGHBOR_MB_DATA and (ii) arithmetically decoding bit stream data over the signal BITSTREAM. The decoder 104 may decode the bins to generate (i) a decoded video sequence of the signal and (ii) neighbor macroblock data for CABAC decoding.

Figure 2:
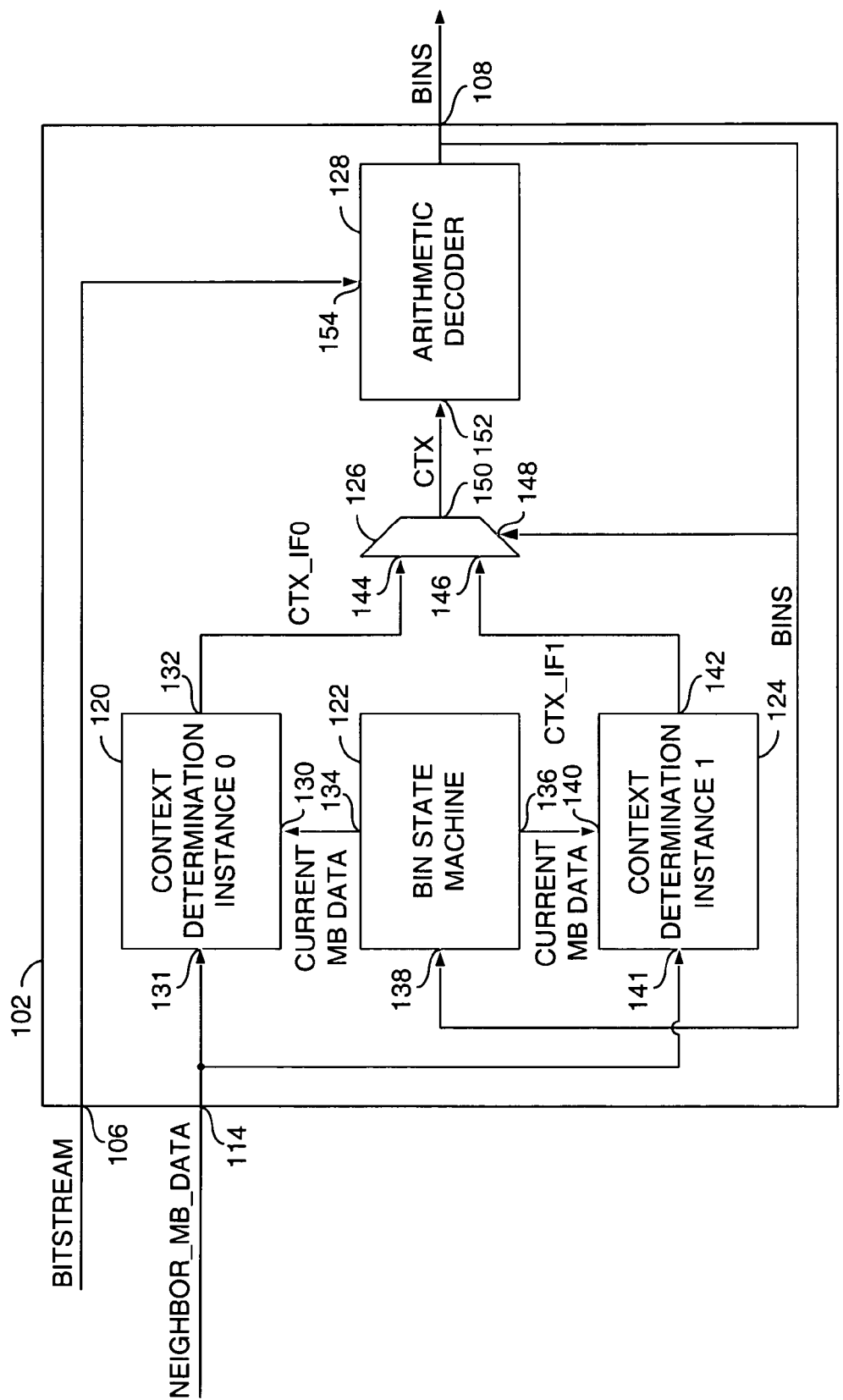
FIG. 2 is a more detailed diagram of a decoder.

Referring to FIG. 2, a detailed diagram of the CABAC decoder 102 is shown. The CABAC decoder 102 generally comprises a block (or circuit) 120, a block (or circuit) 122, a block (or circuit) 124, a block (or circuit) 126 and a block (or circuit) 128. The circuit 120 may be implemented as a context determination circuit. The circuit 122 may be implemented as a bin state machine. The circuit 124 may be implemented as a context determination circuit. The circuit 126 may be implemented as a multiplexer. The block 128 may be implemented as an arithmetic decoder. The arithmetic decoder 128 may be implemented as an H.264 arithmetic decoder.

The context determination circuit 120 may have an input 130 that may receive a signal (e.g., CURRENT_MB_DATA) and an input 131 that may receive the signal NEIGHBOR_MB_DATA, and an output 132 that may present a signal (e.g., CTX_IFO). The bin state machine 122 may have an input 138 that may receive the signal BINS. The bin state machine 122 may have an output 134 that may present the signal CURRENT_MB_DATA and an output 136 that may present the signal CURRENT_MB_DATA. The context determination circuit 124 may have an input 140 that may receive the signal CURRENT_MB_DATA, an input 141 that receives the signal NEIGHBOR_MB_DATA, and an output 142 that may present a signal (e.g., CTX_IF1). The multiplexer 126 may have an input 144 that may receive the signal CTX_IF0, an input 146 that may receive the signal CTX_IF1 and an input 148 that may receive the signal BINS. The multiplexer 126 may have an output 150 that may present a signal (e.g., CTX). The arithmetic decoder 128 may have an input 152 that may receive the signal CTX and an input 154 that may receive the signal BITSTREAM. The arithmetic decoder 128 may generate binary symbols (or bins) in response to context information on the signal CTX and encoded bit stream data over the signal BITSTREAM. Generally, context information is needed to produce each output bin.

The bin state machine 122 may be implemented as a finite state machine. The bin state machine 122 may parse the H.264 bin grammar of the bins as described in the H.264 standard. By following the syntax of the bin, the bin state machine 122 may determine a syntax element from the H.264 bin grammar and the bit index (position) within that syntax element. The syntax elements within the H.264 bin grammar and parsed by the state machine 122 may include:

(i) Mb_type, Mb_skip_flag, Sub_mb_type, Mvd, Ref_idx, Mb_qp_delta, Intra_chroma_pred_mode;
(ii) Prev_intra4×4_pred_mode_flag, Prev_intra8×8_pred_mode_flag, Rem_intra4×4_pred_mode, Rem_intra8×8_pred_mode;
(iii) Mb_field_decoding_flag, Coded_block_pattern, Coded_block_flag, Significant_coeff_flag, Last_significant_coeff_flag; and
(iv) Coeff_abs_level_minus1, Coeff_sign_flag, End_of_slice_flag, Transform_size_8×8_flag.

The syntax elements within the H.264 bin grammar and parsed by the state machine 122 are generally described in the H.264 standard, the relevant portions of which are incorporated by reference. While parsing syntax elements, the bin state machine 122 may also pre-decode the syntax elements which may be needed within the macroblock context calculations. The bin state machine 122 may include state machine logic that may pre-decode the syntax elements. The current macroblock neighbor data to be used for context calculations may include:

1) Macroblock Type (e.g., specific intra or inter prediction mode used to encode the macroblock);
2) Sub Macroblock Type (e.g., for 8×8 inter prediction, the macroblock is divided into 4 regions and each region includes a prediction mode);
3) Reference Index (or ref_idx) (e.g., pointer to the reference frame for inter prediction);
4) Motion Vector Difference (or MVD) (e.g., difference between the predicted motion vector and the actual motion vector for inter macroblocks);
5) Residual Data (e.g., (i) number of non-zero luma or chroma coefficients within a 4×4 coefficient block, (ii) number of non-zero coefficients within a macroblock 4×4 block and (iii) chroma_u_v);
6) Coded Block Pattern (or CBP) (8×8 level indication of the presence of coefficient data);
7) Parsing suffix Part of Syntax Element (or suffix) (e.g., coefficients that consist of prefix and suffix. Suffix may only be used for large coefficients);
8) BinIdx (e.g., index of the current bin within a given syntax element);
9) Current Macroblock Partition (e.g., index of the current position within the macroblock);
10) CompIdx (e.g., indicates x and y MVD component);
11) CtxBlockCat (e.g., encoded type of coefficient block (Luma, Luma DC, Luma AC, Chroma AC, Chroma DC));
12) ScanningPos (e.g., coefficient index within a coefficient block);
13) Top_mb_in_pair (e.g., flag indicating a top macroblock in a pair for MBAFF slices);
14) Syntax Element (e.g., separately encoded integer in the bitstream);
15) Slice Type (e.g., selection of the current slice type (I, P, B); and/or
16) List (e.g., indicates forward or backward prediction for ref_idx and MVD).

The context determination circuit 120 and the context determination circuit 124 each calculate the context (or subsequent context information) while assuming the value of the bin currently being decoded by the arithmetic decoder 128. The CABAC decoder 102 may allow decoding (via the arithmetic decoder 128) and context calculation (via the bin state machine 122 and the context determination circuits 120 and 124) to occur in parallel. The context determination circuit 124 may assume that the current bin which is being decoded by the decoder 104 is a "1" (or a first predetermined value). The context determination circuit 120 may assume that the current bin which is being decoded by the decoder 104 is a "0" (or a second predetermined value). For example, if the current bin decoded by the decoder 104 is one, the context determination circuit 124 may calculate a first context information. If the current bin decoded by the decoder 104 is zero, the context determination circuit 120 may calculate a second context information. When the bin is available (or has been decoded by the decoder 104), the multiplexer 126 may select the correct context (e.g., either the first context information or the second context information) to be used for the decoder 128 to decode the following bin. The value of the first predetermined value may be varied to meet the design criteria of a particular implementation. The value of the second predetermined value may be may varied to meet the design criteria of a particular implementation. Further predetermined values may also be implemented to meet the design criteria of a particular implementation.

The context calculations are based on which syntax element is currently being parsed (e.g., Mb_type) and the bit position within that syntax element (e.g., BinIdx). Depending upon the syntax element, or a position within the macroblock (e.g., the current macroblock partition within the macroblock), and/or the neighboring macroblock, the current or neighbor macroblock data may be used for the context determination circuit 120 and the context determination circuit 124 to calculate the context. In general, the context may be calculated by following the context determination rules as specified in the H.264 standards. The decoder 102 may arithmetically decode in parallel to calculating context information while the decoder 104 decodes bins to generate the signals VIDEO and NEIGHBOR_MB_DATA.

Figure 3:
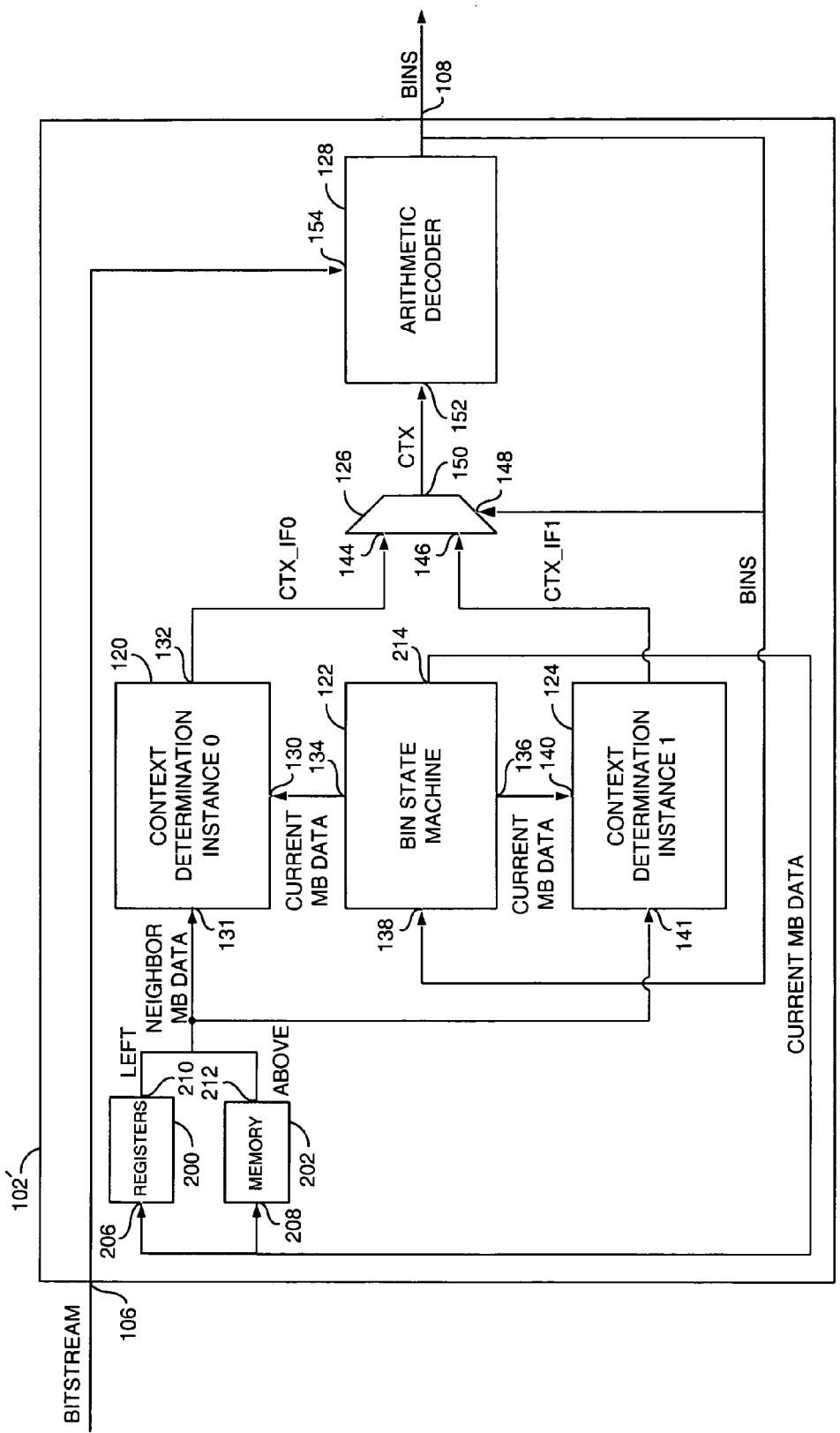
FIG. 3 is an alternate diagram of a decoder in accordance with the present invention.

Referring to FIG. 3, an alternate diagram of a decoder 102' is shown. The decoder 102' generally comprises the context determination circuit 120, the bin state machine 122, the context determination circuit 124, the multiplexer 126, the arithmetic decoder 128, a block (or circuit) 200, and a block (or circuit) 202. The circuit 200 may be implemented as one or more registers. The circuit 202 may be implemented as memory. The circuit 202 may be implemented as a synchronous random access memory. The register 200 may have an input 206 that may receive the signal CURRENT_MB_DATA. The register 200 may have an output 210 that may present the signal NEIGHBOR_MB_DATA. The memory 202 may have an input 208 that may receive the signal CURRENT_MB_DATA. The memory 202 may have an output 212 that may present the signal NEIGHBOR_MB_DATA. The context determination circuit 120 may have an input 131 that may receive the signal NEIGHBOR_MB_DATA. The context determination circuit 124 may have an input 141 that may receive the signal NEIGHBOR_MB_DATA. The decoder 102' may allow a fully autonomous decode without the need for the decoder 104 to provide neighbor macroblock data. The register 200 may store macroblock data for a neighbor spatially located to the left of the current neighboring macroblock. The memory 202 may store macroblock data for the macroblock spatially located above the current neighboring macroblock. The register 200 and the memory 202 may store partially decoded syntax elements. Any one of the software implementations may include a CPU which performs each task (e.g., context calculation and bin decoding). The CABAC decoder 102' may allow decoding (via the arithmetic decoder 128) and context calculation (via the bin state machine 122 and the context determination circuits 120 and 124) to occur in parallel. The decoder 102' may arithmetically decode in parallel to calculating context information while the decoder 104 decodes bins to generate the signals VIDEO and NEIGHBOR_MB_DATA.

The present invention may be applied to a number of multiple CPU software implementations. A CPU may perform each task in parallel. The present invention may be applied to hybrid hardware/software. The hardware may perform the arithmetic decode while the software may calculate the next possible context information.

Given that the basic CABAC decode strategy must be followed, and the CABAC decode strategy forces a series of decode operations and context calculations, infringement on the present invention may be detected from published data sheets generated by an infringer. Such published data sheets may include various levels and profiles of H.264 that are supported, along with VLSI technology (e.g., 0.13 u) used to implement the CABAC decode strategy. Given the level and profile, it may be possible to calculate the arithmetic decode processing rate to determine if the present invention is infringed. Further, if access to a product including an H.264 decoder is given, a predetermined stream may be fed into the unit for decoding (e.g., HD-DVD). Decoding for HD-DVD generally includes known arithmetic decode rates. The display may be recorded to determine if the stream was fully decoded. If the stream was decoded, infringement may be inferred.

While the invention has been particularly shown and described with reference to the preferred embodiments thereof, it will be understood by those skilled in the art that various changes in form and details may be made without departing from the spirit and scope of the invention.

The invention claimed is:

1. A method for context adaptive binary arithmetic decoding comprising the steps of:
 (A) presenting a video signal and macroblock data in response to decoding one or more bins on a binary signal;
 (B) generating said binary signal in response to a bitstream signal and said macroblock data;
 (C) calculating subsequent context information for a macroblock based on a value of said bin currently being decoded;
 (D) arithmetically decoding context information while simultaneously performing step (C);
 (E) calculating first context information by assuming said value of said bin currently decoded is a first predetermined value;
 (F) calculating a second context information by assuming said value of said bin currently decoded is a second predetermined value;
 (G) selecting (i) said first context information if said bin currently decoded is said first predetermined value and (ii) said second context information if said bin currently decoded is said second predetermined value;
 (H) presenting data of a current macroblock;
 (I) parsing H.264 bin grammar of said one or more bins;
 (J) determining a syntax element from said H.264 bin grammar and a bit index position within said determined syntax element; and
 (K) pre-decoding said syntax elements needed to calculate said first context information and said second context information.

2. The method according to claim 1, further comprising the step of:
 storing data of a left and above neighboring macroblock; and
 presenting data of said left and above neighboring macroblock in response to a current neighboring macroblock.

* * * * *